DIGITALLY TUNED TRANSMITTER-RECEIVER

Filed July 13, 1960 4 Sheets-Sheet 1

INVENTORS.
ROGER R. BETTIN
ALWIN HAHNEL
JOHN E.R. HARRISON
ELMER W. SCHWITTEK
BY
T. L. Styner
ATTORNEY

DIGITALLY TUNED TRANSMITTER-RECEIVER

United States Patent Office 3,054,057

Patented Sept. 11, 1962

3,054,057

DIGITALLY TUNED TRANSMITTER-RECEIVER

Roger R. Bettin, West Webster, Alwin Hahnel and John E. R. Harrison, Rochester, and Elmer W. Schwittek, Penfield, N.Y., assignors to General Dynamics Corporation, Rochester, N.Y., a corporation of Delaware Filed July 13, 1960, Ser. No. 42,698
9 Claims. (Cl. 325—383)

This invention relates to transmitter-receiver radio equipment of the type which can be digitally tuned, and is particularly directed to improved means for step-by-step tuning, as distinguished from continuous tuning, of the transmitter-receiver equipment.

In radio communications, the available bandwidth available to radio transmitters and their cooperating receivers is continually becoming more restricted. Bands as close as one kilocycle in separation are now being considered and used. Voice frequencies on a radio carrier, with its carrier and two sideband frequencies, occupies much too much space in the radio frequency spectrum.

Serious thought has been given to the adoption of the old and now well known single-sideband technique where one sideband is eliminated and the carrier is preferably suppressed and reinjected at the receiver. When this technique is used, the carriers generated at the transmitter and receiver must be precisely in step even though it may be impractical to transmit occasional synchronizing pulses. This means the ordinary analog techniques of tuning are not feasible. It is impractical to rotate the shaft of a tuning condenser or reciprocate the plunger and slug of a permeability tuner and to stop the motion with sufficient accuracy to properly tune such equipment. Phase-locked oscillators requiring servo control are too complex and expensive to manufacture, and too unstable in the field to be reliable. The proper ganging of tuning condensers for accurate tracking of the various tunable circuits becomes increasingly difficult as the bandwidth narrows and accurate tuning becomes more acute. The ordinary tuning dial, even with vernier controls of high mechanical gain, cannot produce the required tuning accuracy.

It is, accordingly, one of the objects of this invention to produce an improved tuning system for radio receivers and/or transmitters which are accurate to a high degree.

Some communication equipment must be rapidly, as well as accurately, tuned to new frequencies. The time required to change all the frequency selective circuits from one set of values to another, as contemplated here, is measured in milliseconds. Accordingly, a further object of this invention is a tuning system which may be tuned to new frequencies very rapidly.

When the carrier wave of a communication system is of the order of several megacycles per second, superheterodyning techniques must be employed to change the radiant energy to frequencies which can be readily amplified and detected. Superheterodyne receivers are traditionally plagued by spurious signals resulting from cross-modulation, direct IF interference, image interference, and various combinations of incoming signals and local oscillator harmonics called cross-over spurious signals. Spurious signals, locally generated, are particularly difficult to deal with when the breadth of the band to be received is wide. A still further object of this invention is, accordingly, an improved superheterodyne receiver which will effectively eliminate the spurious signals usually attending mixers and frequency changing circuits.

The objects of this invention are attained by a new and improved digital tuning technique in a multiple conversion superheterodyne. Each digit of a decimal number of the requisite number of significant places is mechanized to select by switches a different frequency-determining element in both the RF selecting circuits and the local generators of injection frequencies. Each digit mechanism is independently selected and operated and no digit is dependent structurally or electrically upon the mechanism of any other digit. Accordingly, the total elapsed time for selecting a new frequency and presetting the resonant circuits are not cumulative among the frequency-determining mechanisms. That is, the technique of this invention permits each of several tuning functions to be carried out simultaneously with no sequential interdependence.

One system constructed according to this invention was capable of tuning to any one of 28,000 channels spaced at one kilocycle intervals from 2 to 30 megacycles. Each channel could be selected by simple make-and-break switches and no variable or continuously tuned elements were employed other than factory adjusted trimmers. Since there is no interdependence of tuning functions, upon a "change channel" command, each switch which enters into the tuning simultaneously seeks its new correct position. Tuning does not depend on precision positioning of any elements. Where switches are employed, approximate positioning of the switching elements is sufficient.

The basic frequency conversion scheme is inherently free from low order spurious signals, compromise having been made in mixer inputs and outputs in such a manner that all spurious signals are kept at a low level, even over a band as wide as 2 to 30 mc. Further, all locally generated injection frequencies are so developed that they reflect the stability and accuracy of a single high precision frequency standard.

Band-pass filter techniques are used throughout the system of this invention to obviate the use of variable intermediate frequency amplifiers, to enhance the reliability of the system. Digital tuning is employed throughout, with one knob per digit. That is, the relative frequency-changing value of each tuning element, or size of the incremental change during step-by-step tuning of each tuning element, is commensurate with the decimal significance of the particular tuning knob operating that element. The numbers of tuning elements are but a small fraction of the numbers of channels which can be received or transmitted. More specifically, only ten tuning elements in each resonant circuit are required for each significant digit of the band over which the equipment may be tuned.

Other objects and features of this invention will become apparent to those skilled in the art by referring to the specific embodiments hereinafter described and illustrated in the accompanying drawings, in which.

Figure 1:
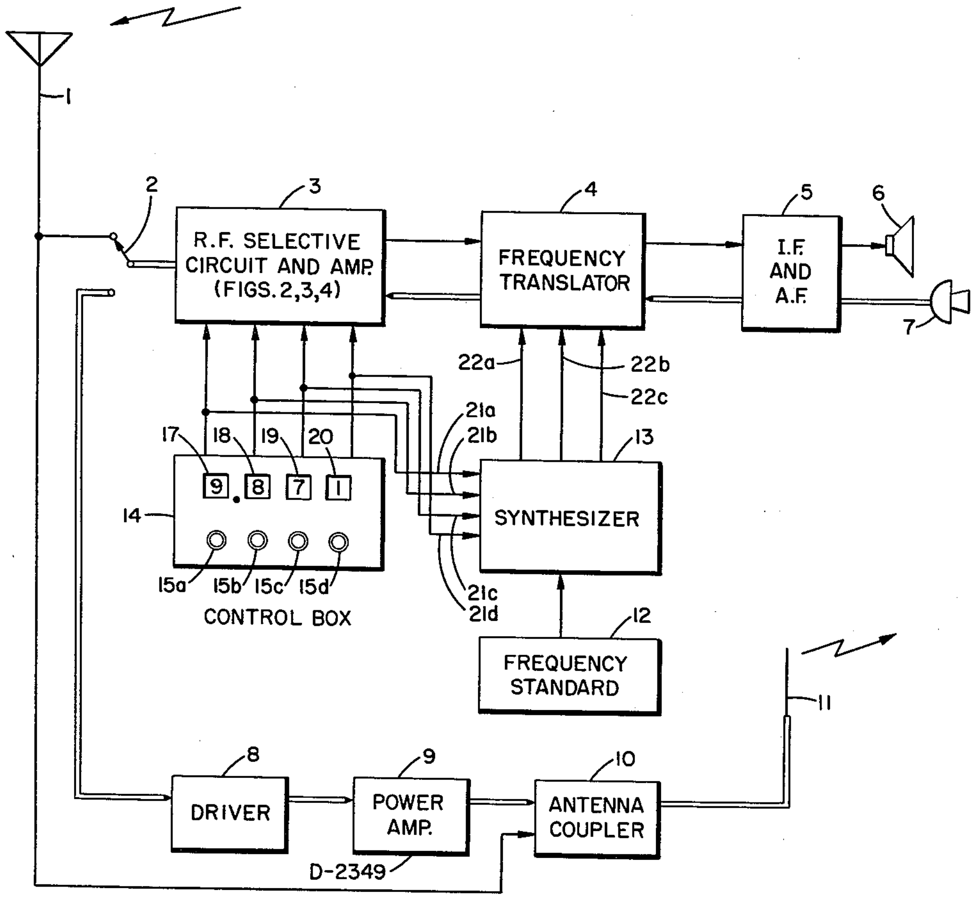
FIG. 1 is a functional block diagram of one transmitter-receiver embodying the features of this invention.

Referring to FIG. 1, the receiving antenna 1 is coupled through switch 2 to the high frequency amplifier 3 with digitally tuned RF selective circuits and hence to the digitally tuned frequency translator 4 where the carrier or sideband, with its signal, is reduced in frequency and applied to the intermediate and audio frequency amplifier and detector 5, and hence to the signal reproducing device 6, such as a loudspeaker. On the other hand, audio signals may originate at microphone 7 and be modulated upon an intermediate frequency in circuit 5 and hence stepped up in frequency in the frequency translator 4. After selective amplification in amplifier 3, the modulated carrier wave is routed to the driver amplifier 8 through switch 2 and hence to the power amplifier 9, through the antenna coupler 10, and hence to the radiating antenna 11. An elementary push-to-talk switch is preferably employed to convert from the receiving mode to the transmitting mode. As will appear hereinafter, the single frequency standard 12, preferably a precision piezoelectric crystal with oven-controlled temperature, regulates the synthesizer 13. From the synthesizer 13 is obtained the various injection frequencies for the frequency translator.

If desired, the radiating antenna 11 may be used as a receiving antenna by connecting the antenna 11 directly to the RF amplifier 3 through the coupler 10.

The control box 14, in the embodiment shown in FIG. 1, has tuning knobs 15*a*, 15*b*, 15*c* and 15*d* operating, respectively, a corresponding number of decimal digital indicators 17, 18, 19 and 20 of the odometer type for displaying, respectively, the significant decimal numbers of the channel being received or transmitted. Each of the knobs has detent or equivalent mechanism and may be rotated to each of ten positions for displaying ten numbers, 0 to 9, for each significant decimal place. An exception may be desired where the "megacycle" knobs are to select a higher, or lower, number of megacycle bands. From the control box 14, mechanical or electrical linkages 21*a*, 21*b*, 21*c* and 21*d* extend to the synthesizer to control, digitally, the selection of the injection frequencies on lines 22*a*, 22*b* and 22*c* to the frequency translator 4. When three mixer stages are used in the translator 4, and three frequency conversions are employed, three injection frequencies on lines 22*a*, 22*b* and 22*c* are used.

From the control box 14, linkages 22*a*, 22*b* and 22*c* also extend to the RF selective amplifier for digitally tuning the RF selection circuits. By simultaneously step tuning the RF circuits in amplifier 3, and step selecting the injection frequencies for trtnslator 13, with the single set of digital control knobs 15, the filter circuits for the product frequencies of the mixer stages may all be fixed in frequency, as will appear. In the example to be amplified hereinafter, the RF selecting circuits are tunable in 1 mc., 100 kc., and 10 kc. steps, while the injection frequencies are changed in steps of 1 mc., 100 kc., 10 kc. and 1 kc. Accordingly, the transmitter-receiver may be tuned in 1 kc. steps from the lowest to the highest megacycle channel for which the equipment may be designed. Although four selector knobs have been shown, the digital information of the four significant places may be preselected automatically and brought into operation by preset pushbuttons, by techniques known in the art.

Figure 2A:
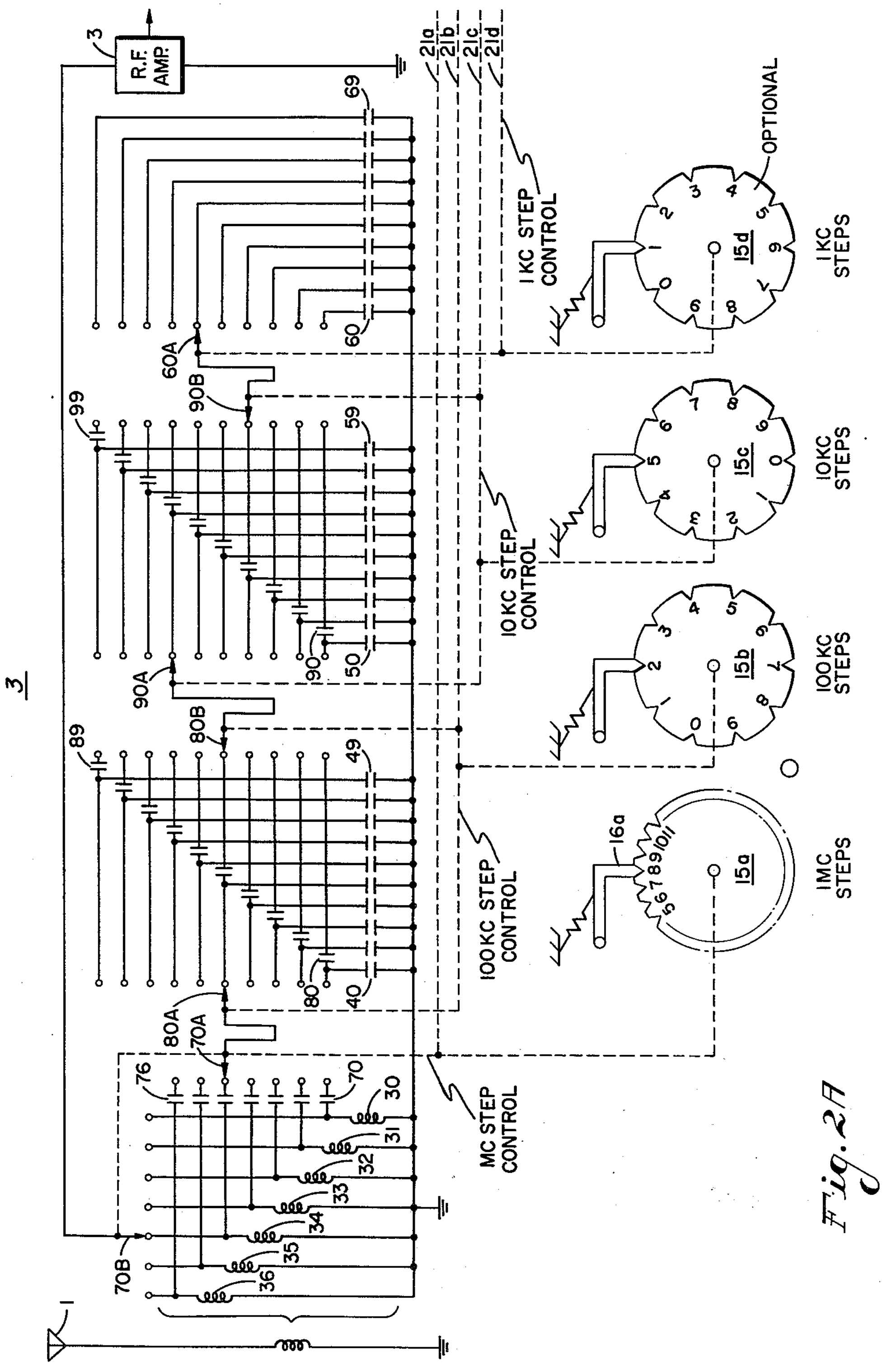
FIG. 2A is a schematic diagram of a position of the digitally tuned RF circuits of the system of FIG. 1.
Figure 2B:
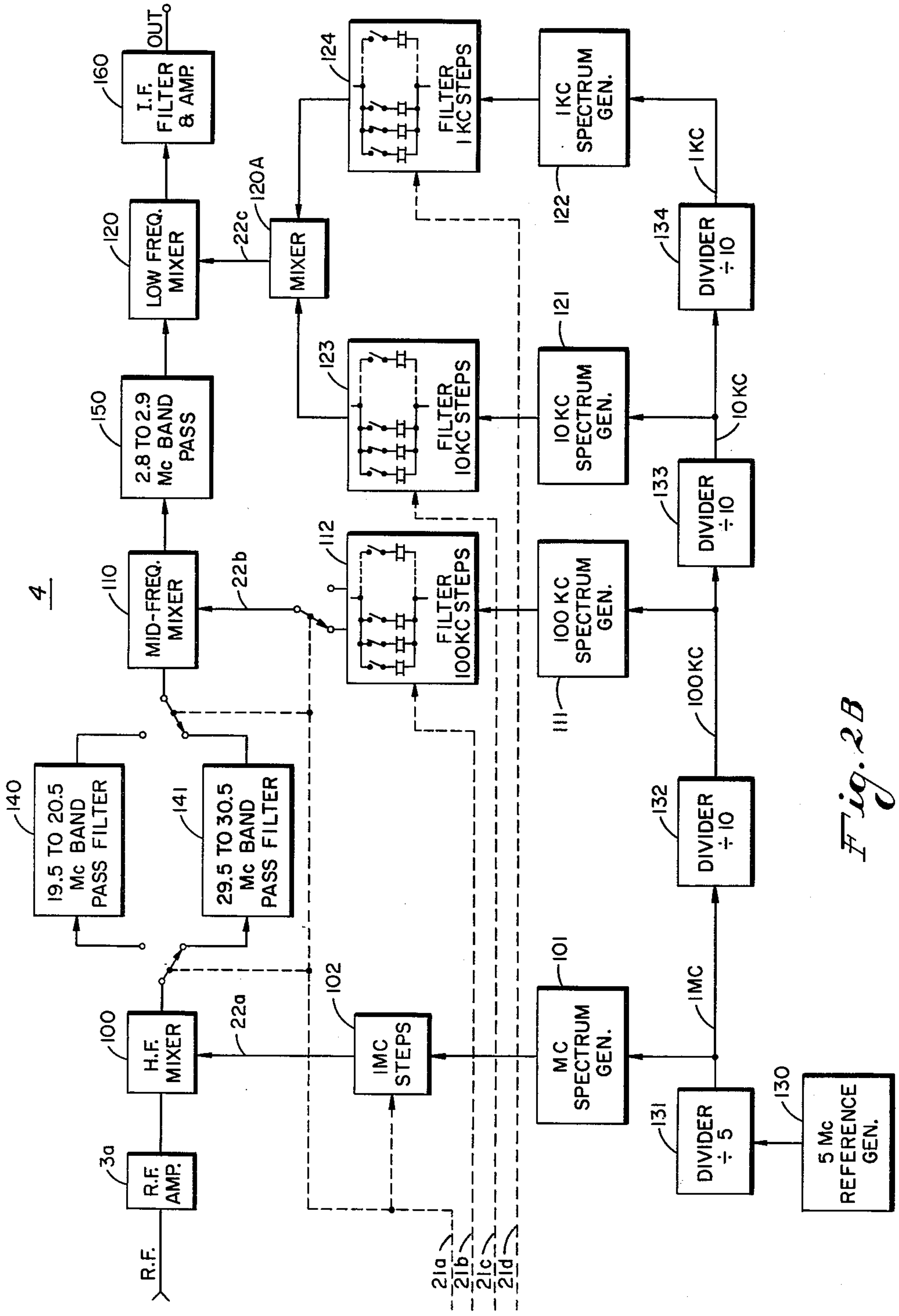
FIG. 2B is a circuit block diagram of the digitally tuned frequency translator and frequency synthesizer of the system of FIG. 1.

When FIGS. 2A and 2B are placed end-to-end, the entire receiver mode of operation of the system of this invention may be seen. One only of the preferred several cascaded and digitally tuned radio frequency circuits of amplifier 3 is shown in FIG. 2A, along with decimally related frequency selection control dials 15*a*, 15*b*, 15*c* and 15*d*. The output of the tuned RF amplifier 3 feeds into the multiple stage frequency translator 4 of FIG. 2B. Each of the step-by-step tuning controls 21*a*, 21*b*, 21*c* and 21*d* from the control knobs 15 extend to the translator of FIG. 2B, as shown, to select appropriate injection frequencies.

Figure 3:
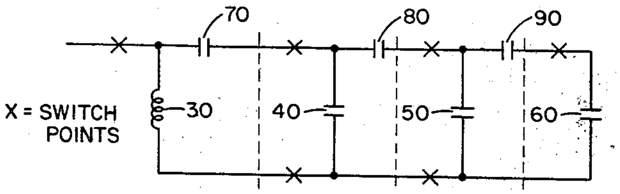
FIG. 3 shows a simplified circuit equivalent to the system of FIG. 2A.

The rationale of the RF selective circuit of FIG. 2A may best be grasped by referring first to FIG. 3, which shows the electrical equivalent of the circuit of FIG. 2A. In FIG. 3, the resonant selective circuit is of the tank type comprising one inductance coil 30 selected from a group of inductance coils paralleled by a system of condensers. The system of condensers comprise parallel condenser 40, condenser 50 and condenser 60 with series condenser 70, series condenser 80 and series condenser 90. The ultimate operation of this array of condensers is that of a conventional tuning condenser of a tank circuit. There are as many inductance coils as there are megacycles in the band to be covered, each inductance coil defining a discrete frequency step of one megacycle in the specific embodiment here considered, and each coil is selectable by switch structure operated by the detented knob 15*a*. The next adjacent network, or group of components, comprising parallel condenser 40 and series condenser 80, will tune any one connected coil through ten frequency steps of 100 kilocycles each. The next adjacent network or group of components comprising parallel condenser 50 and series condenser 90 will adjust the resonant frequency of the tank in steps of 10 kilocycles. Finally, the network comprising parallel condenser 60 will adjust the resonant frequency of the tank in discrete frequency steps of one kilocycle. The last tuning step may be omitted if desired in cases where the Q of the tank is not particularly high. The tank circuit of FIG. 3 may be said to comprise repetitive four-terminal networks or component groups, each network comprising one reactance means in parallel to the input terminals of the network and one reactance means in series with the lead to the next adjacent lower digit network. The value of any one of the series condensers determines the capacity range of all succeeding networks of lower decimal significance. By properly selecting series condensers 70 to 76, for example, the range of resonant frequencies produced by the ten "100 kc." tuning condensers 40 to 49, FIG. 2A, will be the same throughout the 2 to 3 megacycle band as throughout the 20 to 21 megacycle band. That is, with a single set of ten capacitors for each capacitance at 40, 50, 60, 70, 80 and 90, we can step tune the entire array in fixed decimal increments throughout each megacycle range selected by the inductances 30 of the tank.

It is possible, as shown in FIG. 2A, to select the condensers and coils in each group by detent control switch mechanisms operated by control knobs 15*a*, 15*b*, 15*c* and 15*d*. Each switch mechanism establishes the particular incremental frequency change corresponding to the significance of the decimal place of the tuning knob. In FIG. 2A, any one of the coils 30 to 36, inclusive, and their respective series connected condensers 70 to 76, inclusive, will select frequencies in discrete one megacycle steps. The number of megacycle coils is, of course, a matter of choice. In one embodiment, twenty-eight coils were employed for frequencies from 2 to 30 megacycles. The control mechanism shown for the one mc. steps comprises wheel or knob 15*a* with a notched periphery and with the spring-pressed pawl 16*a* and with numbered indicia opposite each notch to indicate the "megacycle" position of the wheel. A mask with windows opposite the effective number may be employed for easy reading, as suggested in FIG. 1, if desired. The "megacycle" knob 15*a* operates switches 70A and 70B. The "100 kc." knob 15*b* operates switches 80A and 80B. The "10 kc." knob 15*c* operates switches 90A and 90B. The "1 kc." knob 15*d* operates switch 60A. The operating mechanisms may be either mechanical or electrical, and may assume many configurations, as expected. Each of the operating knobs 15*b*, 15*c* and 15*d* has ten notches numbered 0 to 9 for controlling the ten switch positions.

Control mechanisms 15*a*, 15*b*, 15*c* and 15*d* which control, respectively, the 1 mc., 100 kc., 10 kc. and 1 kc. steps of the resonant tank circuit of FIG. 2A are extended to the frequency synthesizer of FIG. 2B to make corresponding digital changes in the sources of locally generated injection frequencies to properly operate the multiple conversion superheterodyne receiver, according to this invention.

Referring again to FIGS. 2A and 3, the value of the particular series condensers 70 to 76 which are selected by the "1 mc." switch determines the maximum possible effective range of the ten capacitances 40 to 49 selectable by switch 80A. If, for example, condenser 70 has two units of capacity, the condensers 40 to 49 to the right could but divide these two units of capacity into ten equal parts. If, however, condenser 76 comprised, say, twenty units of capacitance, as when a different megacycle range of frequencies is desired, the same ten condensers 40 to 49 to the right will still divide the twenty units of series capacity into ten equal parts. Likewise, whatever may be the value of the connected series condensers 80 to 89, the condensers 50 to 59 to the right of condenser 80 will divide the effective capacity of the series condenser into ten equal steps. The same comments can be made concerning the division into ten equal parts of the effective capacity of the selected condensers 90 to 99 by the ten shunt condensers 60 to 69. The troublesome effects of the square-law relationship between capacity and frequency is effectively obviated by the novel tuning circuit of this invention; and, more importantly, the digital tuning controls of this invention is easily interlocked with the local injection frequency generators of the frequency translator, thus permitting fixed tuned IF transformers.

The frequency translator 4 of FIG. 1, which couples to the end of the RF selective circuit and amplifier 3, is expanded in FIG. 2B. The frequency translator reduces the received signal in the 2 to 30 megacycle range to an IF frequency of, say, 500 kc. for application to the IF amplifier 5. In FIG. 2B, the digitally selected RF signal is amplified and selected, as desired, by RF amplifier 3*a*. This selected RF signal is successively mixed in the high-frequency mixer 100, mid-frequency mixer 110 and low frequency mixer 120. The injection frequency for each mixer is obtained from the single reference frequency generator 130 which, according to this invention, is the only generator of required high frequency stability. Preferably, the generator 130 is controlled by a crystal which is accurately ground and is placed in an oven of good temperature stability. In the example chosen, the reference frequency generator generates a stable wave of 5 megacycles which is immediately reduced to 1 megacycle by divider 131. The output of the reference generator is then successively divided in dividers 132, 133 and 134. Where the injection frequencies must be tuned digitally in steps of 1 mc., 100 kc., 10 kc. and 1 kc., respectively, the frequency dividers each divide by 10. To the output of each divider is coupled a spectrum generator. Spectrum generators 101, 111, 121 and 122 are respectively coupled to the output of each of the dividers 131, 132, 133 and 134.

The spectrum generator 101 preferably comprises means for generating an impure wave rich in harmonics and containing all of the frequencies between the lowest and highest frequencies that are required for injection into the mixer 100. One spectrum generator which may be employed at 101 may comprise the spectrum generator disclosed in the copending patent application filed January 29, 1960 by John E. R. Harrison, Serial No. 5513, and assigned to the assignee of this application. In this spectrum generator, the sine wave of the reference generator is amplified and then differentiated to produce sharp spikes which are in turn employed to over-drive a transistor or a diode. Such a generator will provide a relatively flat spectrum throughout the desired frequency range which, in the example treated here, extends from 2 megacycles to above 30 megacycles. The spectrum, when graphed, is comb-like in shape with amplitude peaks at regular frequency intervals. Where the input reference frequency is one megacycle, these peaks will be found at one megacycle intervals.

Filter 102 contains a plurality of crystal filters which will select any one of a plurality of different megacycle signals from the output of the spectrum generator 101. The resonant frequency of the crystals are spaced apart one megacycle. One crystal at a time is chosen by the switch mechanism operated by linkage 21*a*.

Likewise, the spectrum generator 111 driven by the output of divider 132 generates a spectrum of frequencies between 22 and 33 megacycles with a comb-shaped spectrum, the frequency peaks being spaced apart, in this case, 100 kc. Comb-shaped spectrums are likewise produced at the output of spectrum generators 121 and 122, the dominant frequencies being spaced 10 kc. and 1 kc., respectively, corresponding to the driving frequencies obtained at the outputs of dividers 132 and 134.

Filter 112 contains ten separate crystals designed to pass ten different megacycle signals from spectrum generator 111, the resonant frequency of the several crystals being spaced 100 kc. apart. The selection of one of the ten filter crystals in filter 112 is accomplished by linkage 21*b*.

Filter 123 contains ten crystal filters spaced in frequency 10 kc. apart and adapted to pass anyone of ten signals from generator 121. Selection of the desired crystal filter is effected by linkage 21*c*.

Crystal filter 124 contains ten crystals which will selectively pass anyone of ten signals spaced 1 kc. from generator 122. The selection of the desired crystal is effected by linkage 21*d*. It has been found convenient to combine the output waves of filters 123 and 124 in mixer 120A and to inject the combined wave into mixer 120, thus saving one conversion of the signal frequency. Specific disclosures of particularly suitable crystal filters 123 and 124 and their spectrum generators may be found, respectively, in copending applications in the name of John E. R. Harrison, Serial No. 42,533, filed July 13, 1960, and Serial No. 42,534, filed July 13, 1960, each entitled "Crystal Filters for Multifrequency Source," and both assigned to the assignee of this application.

It will be noted now that the increment of frequency change at the outputs of filters 102, 112, 123 and 124 are respectively 1 mc., 100 kc., 10 kc. and 1 kc., and that these incremental changes are interlocked, respectively, with the increments of RF frequency changes of 1 mc., 100 kc., 10 kc. and 1 kc. of the tuning circuits of FIG. 2A. According to an important feature of this invention, these interlocks permit fixed, tuned circuits at the output of each of the mixers 100, 110 and 120. Further, the width of the passband of each filter corresponds with the steps in frequency of the associated injection filter. For reasons which will more fully appear hereinafter, the two bandpass filters 140 and 141 are alternately connected in the output circuit of mixer 100. The passband of filters 140 and 141 are spaced apart and are each in width equal to the steps in frequency of the injection frequency. In the example of this disclosure, band-pass filter 140 passes all frequencies between 19.5 and 20.5 megacycles, the center of the bandpass being at 20 megacycles, while the filter 141 centers at 30 megacycles, passing the one megacycle band between 29.5 and 30.5 megacycles.

Likewise, the passband of filters 150 and 160 are equal, respectively, to the steps in the injection frequency to the associated mixer. Band-pass filter 150 passes a band 100 kc. wide which is, in the example illustrated, between 2.8 and 2.9 megacycles, while band-pass filter 160 passes a band several kc. wide centered at .5 megacycle, as required for proper audio response. As stated, the "10 kc." signal from filter 123 may be combined with the "1 kc." signal from filter 124 in mixer 120A before applying the combined signal to mixer 120, so that the band-pass filter 160 passes any selected kilocycle of the 2.8 mc. to 2.9 mc. band presented to the mixer 120.

Figure 4:
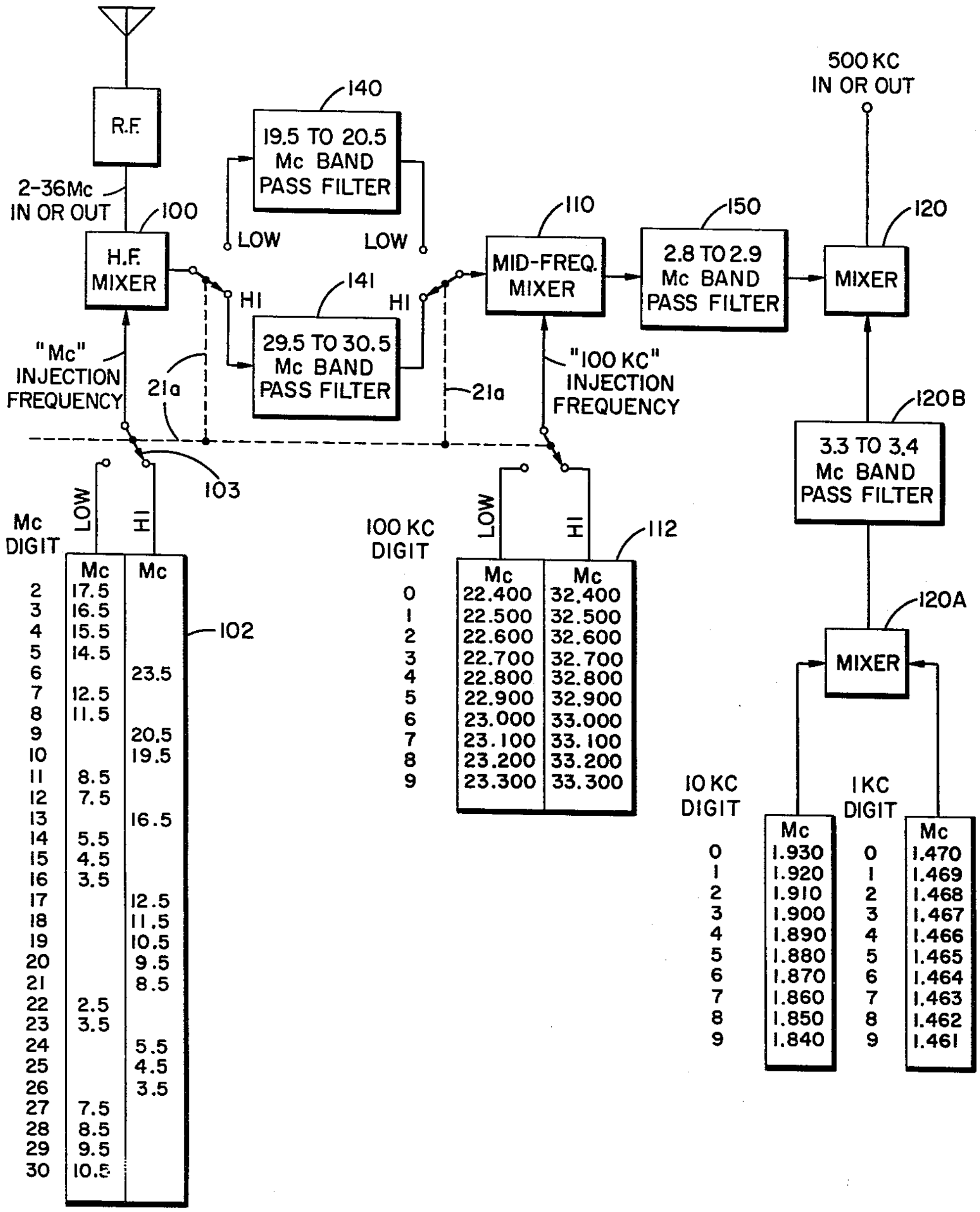
FIG. 4 shows specific frequency values of one synthesizer of this invention.

The frequency translator 4 of FIG. 2B is redrawn in FIG. 4 so that a specific set of injection frequencies, found to produce a minimum of spurious mixer signals, may be demonstrated. Like reference characters refer to similar elements in FIGS. 2B and 4. The output of filter 102 for each megacycle digit of the received signal dialed in by the "1 mc." knob 15*a* and the control linkage 21*a* is shown opposite the megacycle digit in either of two columns, "high" or "low." In the example, megacycle digits from 2 to 30 are shown. By employing the two band-pass filters 140 and 141 in the output of mixer 100, it is possible to employ one injection frequency to serve as the proper injection frequency for two or more different incoming signals and provide an alternate path wherever a spurious mixer product occurs in the original path. Switch interlocks for selecting either the "high" or "low" band-pass filter, 140 or 141, selects also the proper "high" or "low" injection frequencies from sources 102 and 112. That is, since either of two IF bands appear at the input of mixer 110, the "100 kc." injection frequency must likewise be "high" or "low" from filter 112, as shown, to pass the "100 kc." band-pass filter 150. By selecting the "high" or "low" injection frequencies shown and switching the "high" and "low" filters 140 and 141, spurious signals caused by cross-overs created during the mixing processes are kept at very low values. In the example shown, there are only two 6th order cross-over products throughout the 2 to 30 megacycle range. All other products were 7th order or of higher order and were negligible.

To demonstrate operation, assume a desired antenna signal of 8.251 megacycle. The "8th" position of the megacycle selector 15*a* is chosen. This applies an 11.5 megacycle injection signal to the mixer 100. The 11.5 injection signal added to the 8.251 megacycle signal results in a 19.751 megacycle IF which passes the band-pass filter 140. This 19.751 megacycle frequency is next mixed in mixer 110 with 22.600 megacycle which is selected by the control knob 15*b* when set at "2." The 19.751 is subtracted from the 22.600 in the second mixer 110 yielding 2.849 in the output of the second mixer, and since this frequency is within the 100 kc. bandpass of the 2.8 to 2.9 megacycle filter 150, it moves on to the third mixer 120. The third mixer changes the 2.849 megacycle signal to .5 megacycle by using an injection frequency of 3.349 megacycles. This third injection frequency is obtained from auxiliary mixer 120A which appropriately combines locally generated frequencies corresponding to 10 kc. digits and 1 kc. digit, and selected by the knobs 15*c* and 15*d*, respectively. The band-pass filter 120B, FIG. 4, is desirable and is also broadband and designed to exclude undesired biproducts of mixer 120A.

It will be noticed that although the sidebands are inverted in the second mixer, they are inverted again in the third mixer so that an upper sideband signal at the RF input produces an upper sideband at the IF output of the translator.

Thus it is seen that according to this invention a wide range of frequencies can be accurately tuned by truly step-by-step or digital tuning techniques. These techniques obviate the time consuming requirements of the more conventional analog type tuning where servo systems are employed for rotating or reciprocating a tuning shaft and the settling time of the servo loops must be tolerated. The digital tuning technique of this invention permits all of the high frequency and intermediate frequency tuning operations to be carried on simultaneously, thus further reducing the time requirements for accepting new incoming RF frequencies. Still further, it is seen that the digitally tuned transmitter-receiver of this invention effectively eliminates spurious signals resulting from the mixing and heterodyning operations.

What is claimed is:

1. A resonant tank circuit comprising a plurality of inductance coils, first switch means for selecting any one of said inductance coils, a first group of tuning condensers, second switch means for selectively coupling any one of said tuning condensers of said first group across the selected one of said coils, a second group of tuning condensers, third switch means for selectively coupling any one of the tuning condensers of said second group across the selected one of said tuning condensers of said first group, a first series of coupling condensers coupled, respectively, in series with said inductance coils, a second series of coupling condensers coupled, respectively, in series with the condensers of said first group of tuning condensers, the capacity values of each of said first group of coupling condensers being so chosen as to produce uniform incremental steps in resonant frequency by said first group of tuning condensers for each selected coil, the capacity values of each of said second series of coupling condensers being so chosen as to produce uniform incremental steps in resonant frequency by the condensers of said second group of tuning condensers for each selected tuning condenser of said first group of tuning condensers, the capacity values of all condensers being such that the two mentioned incremental steps are decimally related.

2. A resonant tank circuit comprising a plurality of inductances, first switch means for selecting any one of said inductances, a plurality of groups of tuning condensers, a plurality of switch means for connecting any one condenser of each group in parallel with any one of said inductances, a plurality of groups of coupling condensers, one condenser of each group of coupling condensers being coupled in series, respectively, with one tuning condenser of an associated group of tuning condensers, the condensers of each group being chosen in capacity value to produce uniform incremental changes in resonant frequency, the incremental changes produced by the condensers of each group being decimally related.

3. A radio receiver comprising a resonant radio frequency tank circuit, a plurality of mixer stages, said mixer stages being coupled in cascade to said resonant circuit, said resonant circuit comprising a plurality of inductances and a plurality of groups of tuning condensers and a plurality of switch means for selectively coupling one condenser from each group in parallel with a selected one of said inductances, the condensers in each group being so chosen in capacity value as to change the resonant frequency of said resonant circuit in uniform incremental steps, the incremental steps of each group of condensers being decimally related; a plurality of local frequency sources, each source being adjustable in frequency step-by-step, the incremental steps of each source being decimally related to the incremental steps of the other sources, said sources being coupled respectively to said mixers, switch means associated with each frequency source for selecting each frequency step, and means interlocking the switch means with said switch means respectively of the group of tuning condensers having incremental steps of one value with the switch means of the frequency source having corresponding incremental steps.

4. A digitally tuned resonant tank circuit comprising repetitively connected four terminal networks, each network having a reactance means in parallel with the input terminals of the network and a reactance means in series with one output terminal, the parallel reactance means of one network being inductive, means for changing each reactance means step-by-step, the increments of reactance change between steps of each parallel reactance means being such as to produce uniform steps in resonant frequency of the tank circuit, the increments of frequency change of each network being decimally related to the increments of frequency change of the remaining networks.

5. A superheterodyne high frequency communication station comprising a tuned RF amplifier, a high frequency mixer, a mid-frequency mixer and a low frequency mixer, said amplifier and mixers being coupled in cascade; a first local oscillator connected to said high frequency mixer, said first oscillator being tunable in distinct megacycle steps, a second local oscillator connected to said mid-frequency mixer, said second oscillator being tunable in distinct 100 kilocycle steps, a third local oscillator connected to said low frequency mixer, said third oscillator being tunable in distinct 10 kilocycle steps, a band-pass filter associated with each mixer, the passband of each filter being in width approximately equal to the increment in frequency change of the oscillator of the associated mixer, said tuned RF amplifier comprising repetitively connected four terminal networks, each network having a reactance means in parallel with the input terminals of the network and a reactance means in series with one output terminal, the parallel reactance means of one network being inductive, means for changing each reactance means step-by-step, the increments of reactance change between steps of each parallel reactance means being such as to produce uniform steps in resonant frequency of the tank circuit, the increments of frequency change of each network being decimally related to the increments of frequency change of the remaining networks, and means for interlocking the step-by-step frequency changing means of each reactance means of said RF amplifier with the step tuning means of the oscillator having corresponding incremental frequency changes.

6. In combination in a high frequency transceiver signaling system for transmitting or receiving a modulated signal in any one of a predetermined number of relatively narrow signal bands throughout a relatively wide range of frequencies, the width of said bands being a decimal fraction of the width of said range, the combination comprising a plurality of cascade-coupled mixer-converter stages, the number of mixer stages corresponding to the number of significant decimal places in said range of frequencies, a local frequency source associated, respectively, with each mixer stage, each source being tunable step-by-step in uniform incremental steps, the size of the incremental steps of each local frequency source being decimally related to the source associated with the next adjacent mixer, a band-pass filter associated with each mixer, the width of the band passed by each filter being commensurate with the incremental step of frequency of the associated source; an antenna, a digitally tuned radio frequency tank circuit coupled between said antenna and the highest frequency mixer-converter stage of said cascade-coupled mixers, said tank circuit comprising an inductance coil, a plurality of tuning condensers, switch means for selectively coupling any one of said tuning condensers in parallel with said inductance coil, a series condenser coupled between one end of each parallel tuning condenser, respectively, and one end of said inductance coil, said series and parallel condensers being so proportioned in capacity as to permit each parallel condenser to change the resonant frequency of said tank circuit in decimally related increments, and interlocking means between each tuning condenser, respectively, and the local source having a corresponding step-by-step incremental frequency change.

7. In combination in heterodyne signaling equipment, a digitally tuned resonant tank circuit comprising repetitively connected four terminal networks, each network having a reactance means in parallel with the input terminals of the network and a reactance means in series with one output terminal, the parallel reactance means of one network being inductive, separate switch means for changing the reactance means of each network step-by-step, the increments of reactance change between steps of each network being such as to produce uniform steps in resonant frequency of the tank circuit, the increments of frequency change of each network being decimally related to the increments of frequency change of the remaining networks; and a multiple conversion frequency translator including a plurality of cascaded mixers, a separate source of injection frequencies coupled to each mixer, each source having a plurality of digitally related frequencies and switch means for selectively applying any one of said frequencies to the associated mixer, the increments of frequency change of each source being decimally related to the increments of frequency change of the remaining sources, the switch means of each of said networks being interlocked with the switch means for selecting injection frequencies.

8. A resonant tank circuit comprising a plurality of inductances, first means for selecting any one of said inductances, a plurality of groups of tuning condensers, a plurality of means for connecting any one condenser of each group in parallel with any one of said inductances, a plurality of groups of coupling condensers, one condenser of each group of coupling condensers being coupled in series, respectively, with one tuning condenser of an associated group of tuning condensers, the condensers of each group being chosen in capacity value to produce uniform incremental changes in resonant frequency, the incremental changes produced by the condensers of each group being decimally related.

9. In combination in a multiple stage superheterodyne high frequency communication system, a high frequency selection circuit comprising a resonant tank, said resonant tank comprising a plurality of inductances, first switch means for selecting any one of said inductances, a plurality of groups of tuning condensers, a plurality of switch means for connecting any one condenser of each group in parallel with any one of said inductances, a plurality of groups of coupling condensers, one condenser of each group of coupling condensers being coupled in series, respectively, with one tuning condenser of an associated group of tuning condensers, the condensers of each group being chosen in capacity value to produce uniform incremental changes in resonant frequency, the incremental changes produced by the condensers of each group being decimally related; a plurality of mixer stages, said stages being coupled in cascade and to said high frequency selection circuit, each mixer stage having a band-pass filter, a plurality of injection frequency oscillators coupled, respectively, to said plurality of mixers, the frequencies of said oscillators each being adjustable step-by-step in uniform increments, the increments of frequency change of each oscillator being decimally related, interlock means for simultaneously stepping the frequencies of said resonant tank and of said oscillators of like frequency increments, said band-pass filters each having a bandwidth approximately equal to the incremental frequency change of the associated oscillator.

References Cited in the file of this patent

UNITED STATES PATENTS

| | | |
|---|---|---|
| 1,943,790 | Franks | Jan. 16, 1934 |
| 2,354,148 | Shaw | July 18, 1944 |
| 2,487,857 | Davis | Nov. 15, 1949 |
| 2,507,576 | Reid | May 16, 1950 |
| 2,529,443 | Bach | Nov. 7, 1950 |
| 2,606,285 | Bataille et al. | Aug. 5, 1952 |
| 2,692,943 | Reid | Oct. 26, 1954 |
| 2,886,708 | Perkins et al. | May 12, 1959 |
| 2,888,562 | Robinson | May 26, 1959 |
| 2,894,133 | Bolie | July 7, 1959 |
| 2,902,596 | Rockwell et al. | Sept. 1, 1959 |

FOREIGN PATENTS

| | | |
|---|---|---|
| 112,453 | Australia | Feb. 13, 1941 |

UNITED STATES PATENT OFFICE

CERTIFICATE OF CORRECTION

Patent No. 3,054,057 September 11, 1962

Roger R. Bettin et al.

It is hereby certified that error appears in the above numbered patent requiring correction and that the said Letters Patent should read as corrected below.

Column 3, line 43, for "trtnslator" read -- translator --; column 7, line 41, for "1 kc. digit" read -- 1 kc. digits --.

Signed and sealed this 15th day of January 1963.

(SEAL)
Attest:

ERNEST W. SWIDER
Attesting Officer

DAVID L. LADD
Commissioner of Patents